United States Patent
Narducci et al.

(10) Patent No.: US 9,269,881 B2
(45) Date of Patent: Feb. 23, 2016

(54) SEEBECK/PELTIER THERMOELECTRIC CONVERSION DEVICE HAVING PHONON CONFINEMENT LAYERS OF CRYSTALLINE SEMICONDUCTOR CONTAINING ANGSTROM-SIZED ORGANIC GROUPS AS SEMICONDUCTOR ATOMS SUBSTITUENTS WITHIN THE CRYSTAL LATTICE AND FABRICATION PROCESS

(75) Inventors: Dario Narducci, Milan (IT); Gianfranco Cerofolini, Milan (IT); Elena Lonati, legal representative, Milan (IT)

(73) Assignee: Consorzio Delta Ti Research, Milan (IT)

( * ) Notice: Subject to any disclaimer, the term of this patent is extended or adjusted under 35 U.S.C. 154(b) by 76 days.

(21) Appl. No.: 14/241,711

(22) PCT Filed: Aug. 28, 2012

(86) PCT No.: PCT/IB2012/054407
§ 371 (c)(1),
(2), (4) Date: Jun. 20, 2014

(87) PCT Pub. No.: WO2013/030763
PCT Pub. Date: Mar. 7, 2013

(65) Prior Publication Data
US 2015/0083178 A1    Mar. 26, 2015

(30) Foreign Application Priority Data

Aug. 30, 2011 (IT) .............................. MI2011A1558

(51) Int. Cl.
| | | |
|---|---|---|
| H01L 35/28 | (2006.01) | |
| H01L 21/00 | (2006.01) | |
| H01L 35/30 | (2006.01) | |
| H01L 35/22 | (2006.01) | |
| H01L 35/34 | (2006.01) | |
| H01L 21/02 | (2006.01) | |

(52) U.S. Cl.
CPC ................ H01L 35/30 (2013.01); H01L 35/22 (2013.01); H01L 35/34 (2013.01); H01L 21/0262 (2013.01); H01L 21/02532 (2013.01); H01L 21/02573 (2013.01)

(58) Field of Classification Search
CPC ......... H01L 35/12; H01L 35/14; H01L 35/22; H01L 35/24; H01L 35/26; H01L 35/30; H01L 35/34
See application file for complete search history.

(56) References Cited

U.S. PATENT DOCUMENTS 3,779,814 A * 12/1973 Miles et al. ................ 136/236.1
2007/0275516 A1   11/2007 Eguchi et al.

FOREIGN PATENT DOCUMENTS

WO   WO-2011/073142 A1   6/2011

* cited by examiner

*Primary Examiner* — Eli Mekhlin
(74) *Attorney, Agent, or Firm* — Novak Druce Connolly Bove + Quigg LLP

(57) ABSTRACT

Significant phonon migration restraint is achieved within a relatively homogeneous polycrystalline doped semiconductor bulk by purposely creating in the crystal lattice of the semiconductor hydrocarbon bonds with the semiconductor, typically Si or Ge, constituting effective organic group substituents of semiconductor atoms in the crystalline domains. An important enhancement of the factor of merit Z of such a modified electrically conductive doped semiconductor is obtained without resorting to nanometric cross sectional dimensions in order to rely on surface scattering eventually enhanced by making the surface highly irregular and/or creating nanocavities within the bulk of the conductive material. A determinant scattering of phonons migrating under the influence and in the direction of a temperature gradient in the homogeneous semiconductor takes place at the organic groups substituents in the crystalline doped semiconductor bulk. Fabrication processes and Seebeck-Peltier energy conversion devices are exemplarily described.

9 Claims, No Drawings

SEEBECK/PELTIER THERMOELECTRIC CONVERSION DEVICE HAVING PHONON CONFINEMENT LAYERS OF CRYSTALLINE SEMICONDUCTOR CONTAINING ANGSTROM-SIZED ORGANIC GROUPS AS SEMICONDUCTOR ATOMS SUBSTITUENTS WITHIN THE CRYSTAL LATTICE AND FABRICATION PROCESS

CROSS REFERENCE TO RELATED APPLICATIONS

This application is a National Phase filing under 35 U.S.C. §371 of PCT/IB2012/054407 filed on Aug. 28, 2012; and this application claims priority to Application No. MI2011A001558 filed in Italy on Aug. 30, 2011 under 35 U.S.C. §119; the entire contents of all are hereby incorporated by reference.

BACKGROUND

1. Technical field

The disclosure relates in general to Seebeck/Peltier effect thermoelectric conversion devices and in particular to devices using layers of conductive or semi conductive material deposited over a substrate even of large size by common planar techniques and with electrical contacts definable with non-critical lithographic or serigraphic techniques.

2. Reference Notions

The Seebeck effect is a thermoelectric phenomenon according to which a difference of temperature at the opposite ends of an elongated conductor or semiconductor generates electricity. The effect, discovered by the physicist Thomas J. Seebeck in 1821, manifests itself with the presence of a voltage difference at the two ends of a conductive bar subjected to a gradient of temperature $\nabla T$. In a circuit including two junctions kept at different temperatures $T_1$ and $T_2$, between different materials A and B the voltage difference between the two junctions is given by:

$$V = \int_{T_1}^{T_2} [S_B(T) - S_A(T)] dT \tag{1}$$

where: $S_A$ and $S_B$ are the Seebeck coefficients (also referred to as thermoelectric powers) relative to the two materials A and B. The voltage values are typically in the order of few μV/K. The Seebeck coefficients depend on the materials, on their absolute temperature and on their structure. The Seebeck effect may be exploited for making devices adapted to measure temperature differences, in terms of voltage differences in a circuit constituted by wires of different materials (thermocouple) or for generating electrical energy (thermopile) by connecting in series a certain number of thermocouples.

From a microscopic point of view, the charge carriers (electrons in metals, electrons and holes in semiconductors, ions in ionic conductors) diffuse when one end of the elongated conductor is at a temperature different from the temperature at the other end. The carriers at higher temperature will diffuse toward the zone at a lower temperature as long as there are different densities of carriers in the portion at lower temperature and in the portion at higher temperature of the elongated conductor. In an isolated system, equilibrium will be reached when, through a diffusion process, heat will become uniformly distributed along the whole conductor. Redistribution of thermal energy due to the movement of charge carriers implies a thermal current and of course such an electrical current will become null when the temperature of the system becomes uniform. In a system where two junctions are kept at a constant difference of temperature, also the thermal current will be constant and therefore a constant flux of charge carriers will be observed. Carrier mobility is reduced by scattering phenomena caused by impurities present in the lattice of the material, by structural defects and by lattice vibrations (phonons). Therefore, the Seebeck coefficient of a material depends in a significant measure on the density of impurities and of crystallographic defects further than on the material phonon spectrum. On the other end, phonons are not always locally in thermal equilibrium. On the contrary they move following the temperature gradient and loose energy by interacting with electrons or other carriers, as well as with the lattice defects. If the phonon-electron interaction is predominant, the phonons will tend to push electrons toward a portion of the elongated conductor loosing energy in the process, thus contributing to the electric field in the conductor film. These contributions are ever more important in the temperature range in which the phonon-electron scattering phenomenon is predominant, that is for $$T \approx \frac{1}{5}\theta_D \tag{2}$$

where $\theta_D$ is the Debye temperature. At temperatures lower than $\theta_D$ there are fewer phonons that are available for energy transfer while at temperatures above $\theta_D$ they tend to lose energy through a sequence of phonon-phonon collisions rather than through repeated phonon-electron collisions.

It is useful to define a thermoelectric factor of merit of a material as:

$$Z = \frac{S^2}{\kappa\rho} \tag{3}$$

where κ and ρ are the heat conductivity and the electrical resistivity, respectively, of the material.

From a technological point of view, the use of Seebeck/Peltier effect thermoelectric converters has being considered for potentially important commercial application. More than half of the heat generated in a thermoelectric power plant is at present dissipated as low enthalpy heat. It is estimated that about 15 millions of megawatt are dispersed in the process of energy conversion alone. Availability of Seebeck generators capable of converting even only part of such amount of low enthalpy heat in electricity would have a significant positive impact on the energy shortage problem.

Known candidates as thermoelectrically active materials generators have a rather low factor of merit. For example, in case of a thin film of n silicon, doped with $5\times10^{15}$ atoms of As per $cm^3$, at room temperature, $Z\approx 10^{-3}$ $K^{-1}$. Values of $ZT\approx 1$ may be obtained only with costly materials of scarce availability such as $Bi_2Te_3$ or alloys of Sb or Se, as an example. In practice, besides few uses at relatively high added value, such as for thermoelectric generation in spacecrafts, the thermoelectric generators based on massive low cost materials achieve conversion yields of the thermal power to electrical power of just about 7%. By comparison, a turbine engine is capable of converting about 20% of the thermal energy to electrical energy.

In order to increase the factor of merit, the numerator of Eq. (3) should be maximized and/or the denominator should be minimized.

Analyzing the denominator, the formula may be written as:

$$Z = \frac{S^2}{\rho(\kappa_{ph} + \kappa_{el})} = \frac{S^2}{\rho\kappa_{ph} + LT}$$

where $$L = \frac{\rho\kappa_{el}}{T} = \frac{\pi^2}{3}\left(\frac{k_B}{q}\right)^2$$

and where $-q$ is the electron charge and the suffixes ph and el indicate pertinence to phonons and to electrons, respectively.

According to Wiedemann-Franz Law, L is almost a universal constant of about $2.44\times10^{-8}$ W$\Omega$K$^{-2}$, because in metals the ratio between heat and electrical conductivities ($\sigma=1/\rho$) is almost the same at a given temperature T. For a good thermoelectric material $\kappa_{el}$, that is $LT/\rho$, should always be much less than $\kappa_{ph}$. That is to say that heat conduction should not be dominated by electrons.

Therefore, the doping of a semiconducting material destined to be used in Seebeck effect devices must be adapted to ensure a high electrical conductivity without significantly affecting heat conductivity.

Analyzing the numerator one has $$S = \frac{k_B}{q}\left(\frac{5}{2} - \ln\left(\frac{N_d}{N_{V-C}}\right)\right) = \frac{k_B}{q}\left(\frac{5}{2} + \ln(q\mu\rho N_{V-C})\right)$$

where $N_{V-C}$ is the density of states in the appropriate band depending on the dopant used and $N_d(=1/q\mu\rho)$ is the active dopant concentration.

Therefore, though S varies with resistivity, it does so logarithmically (that is at a much reduced rate).

3. Discussion of the Prior Art

Lately it has been shown [1, 2] how a system of drastically reduced size (nanowires of silicon with transversal dimensions in the order of 20 nm) and having suitably roughened surfaces may manifest a relatively high thermoelectric factor of merit. Enhancement of the Z factor derives from a "decoupling" between the mean free path figures of phonons and electrons caused by a significant scattering of phonons at the surface of the conductive nanowire. In particular, the important contribution to heat conductivity deriving from acoustic phonons of relatively lower frequency (longer wavelength) may be almost completely eliminated, being null in the material the density of phonons of wavelength greater than the cross section dimensions of the wire. As a consequence, the heat conductivity of silicon drops from $\approx 150$ W m$^{-1}$ K$^{-1}$ (at room temperature for massive Si) to $\approx 1.6$ W m$^{-1}$ K$^{-1}$ (at room temperature for nanowires of Si of 20 nm in cross section). Unfortunately, these test devices made with silicon nanowires are made with techniques unsuitable to industrialization on large scale.

In a prior published patent applications No. WO 2009/125317 and in prior Italian patent application No. VA2009A000082, filed on Dec. 15, 2009, of the same applicant, methods are described for making nanowires of elements belonging to the IV Group of the Periodic Table or of alloys thereof, without requiring the use of advanced lithographic techniques of definition, in the realm of few tens of nanometers, and with a great control of the surface roughness of the nanowires, adapted to modify the mean free paths of phonons and electrons by exploiting even cavity surfaces produced in a controlled manner within the bulk of the nanowires. The disclosed processes though much simpler than the fabrication processes previously used for making nanosized elongated structures, still requires lithographic processing, anisotropic etchings and conformal deposition processes in vacuum.

In prior Italian patent application No. VA2009A000050, filed on Jul. 15, 2009, of the same applicant, a conversion device is described made of a stack of dielectric layers alternated to semiconducting layers even of large area that after deposition are implanted with ions of a noble gas or with N, F, or O, at gradually varied kinetic energy and fluence, and successively subjected to a degassing treatment though thermal cycling for favoring gaseous molecular aggregations within the bulk of the semiconductor that cause formation of nanocavities, uniformly distributed in the material, before being eventually released off in part.

In prior Italian patent application No. VA2009A000050, filed on Jul. 15, 2009, of the same applicant, a conversion device is described made of a stack of dielectric layers alternated to semiconducting layers even of large area. In such bi-dimensional nanometric structure of heat-conductive material the heat-escape area, wh (with w and h width and thickness of such layers), is small enough to prevent direct escape paths across the planar surfaces. When this basic condition is coupled to that of making the escape surfaces not smooth and substantially parallel to the direction of the temperature gradient across a septum, but relatively rough that is with nanometric profile irregularities adapted to contrast migration of reflected phonons in the direction of the temperature gradient across a septum by enhanced net backward inelastic scattering at the surface, a remarkably incremented thermoelectric factor of merit is observed. Surface irregularities with mean peak-to-valley amplitude and mean periodicity comprised between 5 to 20 nm are outstandingly effective. By depositing the conductive material with intermittent air breaks or by depositing the dielectric material in form of a sub-oxide that is successively thermally decomposed to a mixture of stoichiometric dielectric oxide and semiconductor, the above discussed type of nanometric surface irregularities at conductor/dielectric interfaces are obtained.

GENERAL DESCRIPTION OF THE INVENTION

The applicants have found that significant phonon migration restraint may be obtained within a relatively homogeneous crystalline semiconductor bulk. This implies that an important enhancement of the factor of merit Z of an electrically conductive material may be achieved without resorting to cross sectional nanometric dimensions and surface scattering enhancement by making the surface highly irregular and/or creating nanocavities within the bulk of the conductive material.

Scattering of phonons migrating under the influence and in the direction of a temperature gradient in a semiconductor is produced by purposely creating in the crystal lattice of the semiconductor hydrocarbon bonds with the semiconductor, typically Si or Ge.

Si—C—H and Ge—C—H terminations in the crystal lattice of the doped semiconductor prove themselves outstandingly effective as scattering centers of phonons. Angstrom-sized organo-silane or organo-germane groups as substituents of the semiconductor atom within the crystal lattice act as phonon scattering centers. Moreover, the length of the substituent molecule and its specific effectiveness as phonon scattering center may be varied by using organo-silane or organo-germane groups of different order as dopant.

The finding is important for providing effective phonon migration restraint not only within laterally extended conductive layers of multilayer stacks, typically alternated to dielectric layers, but also for enhancing the factor of merit Z of the bulk conductor per se within a conductive body or wire that for this reason may even be made thicker or of larger cross section than otherwise would be feasible. This may greatly simplify the fabrication processes for realizing real world sized Seebeck-Peltier effect conversion septa.

The invention is defined in the annexed claims, the content of which is intended to form part of this description and is here incorporated by express reference.

DESCRIPTION OF EXEMPLARY EMBODIMENTS

A septum of size suitable for practical real world applications may be fabricated without requiring any lithographic or serigraphic definition steps to create parallel conduction paths of nanometric size, by simply forming a substantially homogeneous layer of conductive material of theoretically unlimited thickness, by chemical vapor co-deposition (CVD) until reaching the desired thickness.

Suitable conductive materials are semiconductors such as doped silicon, doped germanium or alloys thereof deposited with a CVD technique utilizing as gaseous precursor compounds a mixture of silane and organosilane or of germane and organogermane, and at least one of $PH_3$, $AsH_3$ and $B_2H_6$, in nitrogen diluents.

Triethyl silane, triethyl germane, trimethyl silane, trimethyl germane and organosilanes and organogermanes with alkyl substituents, comprising at least three carbon atoms are preferred organosilane and organogermane precursor compounds of dopant groups having a hydrocarbon termination.

Metal coated opposite sides of a septum (that may be a slice of desired thickness of the grown homogeneous layer) constitute connectable terminals of the conversion device and would coincide with the hot and cool sides, respectively, of the septum.

Deposition of the semiconductor layer is generally carried out with a common CVD (low pressure CVD, LP-CVD, or plasma-enhanced CVD, PE-CVD) technique using for example: $SiH_4$, $SiH_nCl_{4-n}$ (with n=1, 2, 3), $GeH_4$, $GeH_nCl_{4-n}$ (with n=1, 2, 3), and $PH_3$, $POCl_3$ or $B_2H_6$ for electrical conductivity enhancement doping of the crystalline semiconductor.

One of the advantages of the proposed structure is that it does not require the deposition of a multilayer but simply the formation of one layer only, whose composition is controlled by the reactants and the reaction conditions and whose maximum thickness is controlled by the ability of relieving by intervening treatments the stress stored in the structure during the preparation.

In growing the layer for example by common CVD, LP-CVD or PE-CVD techniques, besides feeding the chosen monomers ($SiH_4$, $GeH_4$, ...) for forming the structural part of the growing semiconductor layer, also the chosen gaseous compound or compounds destined to generate the moieties in the semiconductor material adapted to produce phonon confinement are fed into the deposition chamber.

According to a preferred embodiment the chosen gaseous compound is a trialkylsilane $HSiR_3$, with an alkyl group substituent containing at least three carbon atoms. For example with a substituent group $R=CH_3(CH_2)_4C(CH_3)_3$ or similar organic compound. Due to the much higher stability of the Si—C and C—H bonds with respect to the Si—H and Ge—H bonds, the CVD conditions can be tuned to decompose the latter bonds preserving the former ones. In this way the film will be formed by a silicon or Si—Ge layer embedding (at a concentration controlled by reactant composition and reaction conditions) alkyl groups.

These groups disrupt periodicity in the growing film and because they do not bridge silicon atoms, a phonon impacting a silicon atom in $HSiR_3$ the group will be unable to propagate and transport heat laterally along the film. This mechanism is reminiscent of what had been proposed for phonon mean free path engineering at the surface of silicon nanowires, as reported in the literature, e.g: by Boukai, A. I., Y. Bunimovich, et al., "Silicon nanowires as efficient thermoelectric materials." Nature 451(7175) (2008) 168-171; Hochbaum, A. I., R. K. Chen, et al., "Enhanced thermoelectric performance of rough silicon nanowires." Nature 451(7175) (2008) 163-167; Lee, J.-H., G. A. Galli, et al., "Nanoporous Si as an Efficient Thermoelectric Material." Nano Letters 8(11) (2008) 3750-3754; with the great advantage that no nano-structuration is required.

The concentration of such scattering centers can be tuned to maximize phonon absorption without appreciably reducing electrical conductivity. Borrowing the phonon mean free path values from experience on nanowires, say 30 nm, the concentration of scattering centers should generally be in the interval $10^{16}$-$10^{17}$ $cm^{-3}$, consistent with a concentration of alkyl silane in the feed gas mixture of parts per million assuming a deposition efficiency substantially equal to that for the main feedmonomer.

A fully grown homogeneous layer with or without a dielectric substrate over which it may have been grown, may even be stacked (glued or bonded together) with similar supported layers to any desired height and the stack may be sliced to form Seebeck-Peltier active septa of desired thickness and size.

Metal layers of electrical connection may be formed on opposite side surfaces of the septum in order to connect it to an external circuit.

Metal layers of electrical connection may be formed on opposite side surfaces of the stack or of a stack slice, in order to connect all the conductive layers to an external circuit, either all in parallel or in a series of groups of layers in parallel.

In other words, the deposited metals of electrical connection over opposite ends of the stack of may connect in parallel all the layers of the stack or be patterned in order to define a plurality of groups of layers that are connected in parallel. The groups of layers may then be connected in series by electrical wires welded to a metal on a first end side of the stack and to an offset metal of a different group of parallel connected layers on the opposite end side of the stack, forming a series-parallel network of groups of layers, eventually connected, through two end terminals of the device, to the external circuit.

To this end, also the flanks of the parallelepiped stack or slice thereof may be coated with a passivating dielectric layer over which conductive stripes of a deposited metal layer may be defined for connecting in series distinct groups of layers connected in parallel to each other by conductive stripes of metal defined on the opposite end sides of the stack.

Prior published patent application No. WO2009/125317 and International Application No. PCT/EP2010/069531 of the same applicant disclose such series-parallel electrical interconnection schemes, the description and illustrations of which are to be intended herein incorporated by express reference.

The invention claimed is:

1. A Seebeck-Peltier effect electrically conductive septum with opposite hot-side and cold-side metallizations for connection to an electrical circuit, comprising at least a homogeneous layer of doped polycrystalline semiconductor wherein crystalline domains of the doped polycrystalline semiconductor contain Angstrom-sized organic groups as semiconductor atom substituents within a crystal lattice of the doped polycrystalline semiconductor.

2. The Seebeck-Peltier effect electrically conductive septum of claim 1, wherein said Angstrom-sized organic groups as semiconductor atom substituents are in a concentration comprised between $10^{16}$ and $10^{17}$ cm$^{-3}$ of said doped polycrystalline semiconductor.

3. The Seebeck-Peltier effect electrically conductive septum of claim 1, wherein the semiconductor is doped polycrystalline silicon containing Angstrom-sized organic groups as semiconductor atom substituents groups belonging to the group of $HSiR_3$ and $HGeR_3$, where R is an alkyl group comprising at least three carbon atoms.

4. The Seebeck-Peltier effect electrically conductive septum of claim 1, comprising a stacked plurality of said homogeneous layers interleaved with electrically non conductive layers constituting an electrically conductive septum with opposite hot-side and cold-side metallizations for connection to an electrical circuit.

5. A process for fabricating an electrically conductive homogeneous body of a doped polycrystalline semiconductor adapted to form a Seebeck-Peltier effect septum, comprising the steps of
   a) introducing a non conductive substrate in a vacuum and temperature regulated chemical vapour deposition reactor;
   b) feeding into the reactor a gas mixture comprising at least a gaseous precursor compound of a semiconductor chosen among $SiH_4$, $GeH_4$ and at least a second gaseous precursor compound of the chosen semiconductor, said second gaseous precursor compound having an alkyl group containing at least three carbon atoms;
   c) growing over the non conductive substrate a homogeneous polycrystalline layer of the chosen semiconductor containing Angstrom-sized organic groups as substituents of semiconductor atoms within crystalline domains of said homogeneous polycrystalline layer.

6. The process of claim 5, wherein said second gaseous precursor compound is chosen among the group composed of trialkylsilane and trialkylgermane.

7. The process of claim 5, wherein the chemical vapor deposition process is enhanced by RF energy generated plasma inside the reactor.

8. A conversion device comprising a Seebeck-Peltier effect electrically conductive septum with opposite hot-side and cold-side metallizations for connection to an electrical circuit, comprising at least a homogeneous layer of doped polycrystalline semiconductor wherein crystalline domains of the doped polycrystalline semiconductor contain Angstrom-sized organic groups as semiconductor atoms substituents within a crystal lattice of the doped polycrystalline semiconductor.

9. The conversion device of claim 8, wherein said organic groups are present in a concentration comprised between $10^{16}$ and $10^{17}$ cm$^{-3}$ of said doped polycrystalline semiconductor.

* * * * *